(12) United States Patent
Zhang et al.

(10) Patent No.: US 12,411,065 B2
(45) Date of Patent: Sep. 9, 2025

(54) FINE DETECTION DEVICE AND METHOD FOR CRACK INITIATION AND PROPAGATION OF ROCK SPECIMEN DURING LOADING PROCESS

(71) Applicant: Anhui University of Science and Technology, Anhui (CN)

(72) Inventors: Pingsong Zhang, Anhui (CN); Chang Liu, Anhui (CN); Yuanchao Ou, Anhui (CN)

(73) Assignee: ANHUIUNIVERSITYOFSCIENCE ANDTECHNOLOGY, Huainan (CN)

( * ) Notice: Subject to any disclaimer, the term of this patent is extended or adjusted under 35 U.S.C. 154(b) by 0 days.

(21) Appl. No.: 18/028,052

(22) PCT Filed: Dec. 15, 2022

(86) PCT No.: PCT/CN2022/139237
§ 371 (c)(1),
(2) Date: Mar. 23, 2023

(87) PCT Pub. No.: WO2024/098508
PCT Pub. Date: May 16, 2024

(65) Prior Publication Data
US 2025/0258072 A1  Aug. 14, 2025

(30) Foreign Application Priority Data
Nov. 8, 2022 (CN) .......................... 202211392316.0

(51) Int. Cl.
*G01N 3/16* (2006.01)

(52) U.S. Cl.
CPC ....... *G01N 3/16* (2013.01); *G01N 2203/0003* (2013.01); *G01N 2203/0019* (2013.01);
(Continued)

(58) Field of Classification Search
CPC ............. G01N 3/16; G01N 2203/0003; G01N 2203/0019; G01N 2203/0658;
(Continued)

(56) References Cited

U.S. PATENT DOCUMENTS

2022/0412855 A1* 12/2022 Feng .................... G01N 3/12

FOREIGN PATENT DOCUMENTS

CN 115541385 A * 12/2022 ............... G01N 3/02

* cited by examiner

Primary Examiner — Jonathan M Dunlap

(57) ABSTRACT

The present disclosure provides a fine detection device and method for crack initiation and propagation of a rock specimen during loading process. The device comprises an organic glass skeleton, a plurality of sensor support skeletons, a multi-parameter dynamic acquisition system, a servo press bearing platform and a computer, wherein the organic glass skeleton is placed in the middle of the servo press bearing platform, the sensor support skeletons are arranged inside the organic glass skeleton, the rock specimen is arranged inside the sensor support skeleton, the multi-parameter dynamic acquisition system is fixedly arranged on the sensor support skeleton, the multi-parameter dynamic acquisition system is in contact with the rock specimen, and the multi-parameter dynamic acquisition system and the servo press bearing platform are electrically connected to the computer.

20 Claims, 10 Drawing Sheets

(52) U.S. Cl.
CPC ............... *G01N 2203/0064* (2013.01); *G01N 2203/0066* (2013.01); *G01N 2203/0617* (2013.01); *G01N 2203/0658* (2013.01)

(58) Field of Classification Search
CPC ... G01N 2203/0066; G01N 2203/0617; G01N 2203/0064
See application file for complete search history.

FINE DETECTION DEVICE AND METHOD FOR CRACK INITIATION AND PROPAGATION OF ROCK SPECIMEN DURING LOADING PROCESS

CROSS-REFERENCE TO RELATED APPLICATION

This patent application is a National Stage entry of Patent Cooperation Treaty Application No. PCT/CN2022/139237 filed Dec. 15, 2022, which claims priority to Chinese Patent Application No. 202211392316.0, filed with the China National Intellectual Property Administration on Nov. 8, 2022, the disclosures of which are incorporated by reference herein in their entirety as part of the present application.

TECHNICAL FIELD

The present disclosure relates to the field of rock mechanics test monitoring, in particular to a fine detection device and method for crack initiation and propagation of a rock specimen during loading process.

BACKGROUND

The rock mechanics test is important means to understand and explore rock properties. The crack initiation and propagation of loaded rock is one of hot issues in rock mechanics test research. The original conditions, heterogeneity and anisotropy of rock determine that irregular volume expansion and crack propagation occur when the rock is loaded. The fracture process of the loaded rock is irreversible, and the initiation and propagation of cracks inside and on the surface of rock are important factors capable of affecting the mechanical and physical properties of rock. At the same time, the initiation and propagation of cracks also have a great influence on the migration of water and gas in the rock. The fracturing mechanical behavior of the loaded rock can be deeply understood by clarifying the crack initiation and propagation law in the rock fracturing process, and then the essence of rock fracturing is understood.

Scanning electron microscope (SEM) and CT scanning are representative nondestructive testing methods for the dynamic development of rock cracks. However, both of SEM and CT scanning have high requirements for the size of the specimen, generally the diameter and height are less than 50 mm, and SEM can only obtain the surface crack evolution situation of the rock specimen. With the increase of the specimen, CT requires more energy for the CT machine in order to achieve better resolution. The high-energy and high-resolution CT testing machine is a big technical problem.

By analyzing the rock specimen, the background physical field of the rock specimen is basically stable before loading. During loading, under the action of force, deformation and crack initiation occur in the rock specimen. These changes lead to changes in the physical field of the rock specimen, such as resistivity, wave velocity and the like. Meanwhile, sound waves can be excited at the fracture position. If these changing physical fields and even sound waves can be caught, the crack initiation and propagation of the rock specimen can be obtained. Therefore, it is necessary to design a fine detection device and method for crack initiation and propagation of a rock specimen during loading process.

SUMMARY

The present disclosure aims to provide a fine detection device and method for crack initiation and propagation of a rock specimen during loading process. The whole testing process is dynamic. The device is simple in structure, convenient to operate and wide in application range. In cooperation with various parameters, the fine detection for crack initiation and propagation of the rock specimen during loading process can be obtained, and plays an important role in evaluating the damage evolution degree of the rock specimen and monitoring the complex environments of the rock specimen with additional initial cracks and seepage field.

In order to achieve the-mentioned purpose, the present disclosure provides the following scheme.

A fine detection device for crack initiation and propagation of a rock specimen during loading process comprises an organic glass skeleton, a plurality of sensor support skeletons, an electrical parameter acquisition system, a sound emission signal acquisition system, a distributed optical fiber sound wave acquisition system, a servo press bearing platform and a computer, wherein the organic glass skeleton is placed in the middle of the servo press bearing platform, the sensor support skeletons are arranged inside the organic glass skeleton, the rock specimen is arranged inside the sensor support skeleton, the electrical parameter acquisition system and the sound emission signal acquisition system are fixedly arranged on the sensor support skeleton, the distributed optical fiber sound wave acquisition system is fixedly arranged on the inner wall of the organic glass skeleton, the electrical parameter acquisition system, the sound emission signal acquisition system and the distributed optical fiber sound wave acquisition system are in contact with the rock specimen, and the electrical parameter acquisition system, the sound emission signal acquisition system and the distributed optical fiber sound wave acquisition system are electrically connected to the computer;

the electrical parameter acquisition system is used for collecting the parameter variation characteristics of the rock specimen in the loading and fracturing process;

the sound emission signal acquisition system is used for acquiring the spatial position generated by the internal fracture of the loaded rock specimen; and the distributed optical fiber sound wave acquisition system is used for determining the intensity of vibration and the three-dimensional spatial position.

Optionally, the servo press bearing platform is composed of a pressure head device and a bearing platform, the bearing platform is provided with the organic glass skeleton, and the pressure head device is arranged just above the central axis of the organic glass skeleton.

Optionally, the eight sensor support skeletons are respectively uniformly arranged in the organic glass skeleton, the sensor support skeleton comprises an upper connector, probe setters and a lower connector, the organic glass skeleton is in a hollow cylindrical shape, the upper connectors are equidistantly arranged on the upper side inside the organic glass skeleton, the lower connectors are arranged on the lower side inside the organic glass skeleton corresponding to the upper connectors, the probe setters are arranged between the upper connector and the lower connector, the probe setter is rectangular, the electrical parameter acquisition system is fixedly arranged on the eight probe setters, and the sound emission signal acquisition system is fixedly arranged on the four uniformly distributed probe setters.

Optionally, the electrical parameter acquisition system comprises a parallel electrical acquisition module, test electrodes, a B electrode, an N electrode and electrode springs, there are thirty-two test electrodes, one B electrode and one N electrode, four electrode grooves are uniformly arranged in the probe setter, the top of one probe setter is additionally provided with an electrode groove for placing the B electrode, the bottom of the other probe setter opposite to the probe setter is additionally provided with an electrode groove for placing the N electrode, the electrode spring is arranged in the electrode groove, the top of the electrode spring is provided with the test electrode, the B electrode and the N electrode, the test electrode, the B electrode and the N electrode are in contact with the rock specimen, the contact surfaces of the test electrode, the B electrode and the N electrode with the rock specimen are curved surfaces with the same curvature as that of the rock specimen, the test electrode, the B electrode and the N electrode are electrically connected with the parallel electrical acquisition module, and the parallel electrical acquisition module is electrically connected to the computer.

Optionally, the sound emission signal acquisition system comprises sound emission probes, probe springs and a sound emission acquisition module, three probe grooves are uniformly arranged in the probe setter, the probe spring is arranged in the probe groove, the top of the probe spring is provided with the sound emission probe, the sound emission probe is in contact with the rock specimen, the contact surface between the sound emission probe and the rock specimen is a curved surface with the same curvature as that of the rock specimen, the sound emission probe is electrically connected to the sound emission acquisition module, and the sound emission acquisition module is electrically connected to the computer.

Optionally, the distributed optical fiber sound wave acquisition system comprises a multi-channel distributed optical fiber sound wave acquisition module and a distributed optical fiber group, there are six distributed optical fibers in the distributed optical fiber group, the first to the fifth distributed optical fiber are equidistantly spirally arranged on the inner wall of the organic glass skeleton, the sixth distributed optical fiber is vertically arranged on the inner wall of the organic glass skeleton, the distributed optical fiber is a bare fiber coated with only one layer of an optical fiber material, the first to the sixth distributed optical fiber are respectively electrically connected to the multi-channel distributed optical fiber sound wave acquisition module, and the multi-channel distributed optical fiber sound wave acquisition module is electrically connected to the computer.

Preferably, a sound insulation protective cover is placed outside the fine detection device for crack initiation and propagation of a rock specimen during loading process.

The present disclosure further provides a fine detection method for crack initiation and propagation of a rock specimen during loading process, applied to the fine detection device for crack initiation and propagation of a rock specimen during loading process, comprising the following steps:

step one, putting a standard rock specimen inside a device, and enabling a test electrode and a sound emission probe to be in close contact with the rock specimen by adjusting a spring;

step two, connecting all transmission lines, starting a pressure head device to be in pre-contact with the rock specimen, and then starting the pre-acquisition and pre-processing of data to ensure that each sensor is in an effective working state;

step three, loading the rock specimen, and acquiring the real-time change situation of the resistivity of four circular electrical sections from top to bottom through the collection of electrical parameters, wherein when cracks appear in the rock specimen, the corresponding performance is high resistance; through the collection of sound emission data, the fracturing spatial position and time of the rock specimen are acquired; through the collection of distributed optical fiber sound waves, the vibration signal during rock fracturing is acquired; through the cooperation of multiple optical fibers, the location of fracture position and crack size of the loaded rock specimen is realized, and at the same time, the data is recorded and stored in real time; and step four, through single-field parameter analysis method, multi-field parameter conjoint analysis method and digital rock core reconstruction method based on field parameters, mapping and analyzing each parameter, and finely identifying the crack propagation of the rock specimen.

Optionally, in the step four, the single-field parameter analysis method is specifically as follows:

the single-field parameter analysis method refers to the analysis of the response of a certain parameter in combination with the time-force curve of loading, and the common variable is time: the standard rock specimen is placed in the device, and a servo device is used for loading until the standard rock specimen is completely destroyed; the whole recording time in the loading and fracturing process of the rock specimen, axial pressure and parameters to be analyzed are continuously collected; the time is taken as the x axis, the axial pressure and the corresponding parameters to be analyzed are taken as the double y axes to draw a graph, so that the corresponding response curve can be obtained; and then, according to the sudden change of the parameter, a basis is provided for the analysis of the rock crack propagation mechanism.

Optionally, the multi-field parameter conjoint analysis method is specifically as follows:

the multi-field parameter conjoint analysis method refers to the comparative analysis of multi-field parameters, the common variable is time, and the multi-field parameters at a certain moment are screened out in turn, and the correlation analysis is carried out to obtain the response correlation among the parameters: the standard rock specimen is placed in the device, and the servo device is used for loading until the standard rock specimen is completely destroyed, and the time in the whole loading and fracturing process of the rock specimen, axial pressure, resistivity, spontaneous potential, electrode current, electrode potential, sound wave amplitude and sound emission event count are continuously collected and recorded. According to the common variable of time, the parameter values at different moments are counted and correlation analysis is carried out;

the correlation analysis of each parameter value specifically comprises correlation analysis between two parameters, correlation analysis among three parameters and correlation analysis among more than three parameters; the correlation analysis between two parameters is specifically as follows: one parameter to be analyzed at a certain loading moment of measuring points is taken as the x axis, and the other parameter to be analyzed is taken as the y coordinate to get points; then, curve fitting is carried out to obtain a corresponding correlation curve of the two parameters, and the identification basis is provided for the crack initiation and propagation of the loaded rock specimen according to the slope of a fitted curve; the correlation analysis among three parameters is specifically as follows: the first parameter to be analyzed at a certain loading moment of measuring points is taken as the x axis, the second parameter to be analyzed is taken as the y coordinate, and the third parameter to be analyzed is taken as the z coordinate to get points; then, surface fitting is carried out to obtain a response relation curved surface based on the three parameters, and the identification basis is provided for the crack initiation and propagation of the loaded rock specimen according to the curvature radius of a fitting surface; and the correlation analysis among more than three parameters is as follows: based on SPASS software, multiple linear regression analysis or multiple nonlinear regression analysis is carried out, and through the conjoint analysis of multiple parameters, a reference is provided for fine detection of the initiation and propagation of cracks in the rock specimen.

Optionally, the digital rock core reconstruction method based on field parameters is specifically as follows:

according to different physical field parameters, the geophysical field reconstruction of the digital rock core is realized: the standard rock specimen is placed in the device, and the servo device is used for loading until the standard rock specimen is completely destroyed; through continuous testing, the distribution situations of the parameters to be analyzed at different three-dimensional coordinate points at different moments are obtained; and accordingly, the spatial distribution situation of the parameters to be analyzed at a certain loading moment is obtained, that is, the different values of the parameters to be analyzed of the digital rock core at a certain loading moment can be obtained by taking different loading moments.

According to the specific embodiments provided by the present disclosure, the present disclosure has the following technical effects: the fine detection device and method for crack initiation and propagation of a rock specimen during loading process provided by the present disclosure realize the parameters such as resistivity profile, natural potential, current, potential, sound emission events, optical fiber vibration signals and the like in the damage process of the rock specimen under uniaxial loading conditions. The whole testing process is dynamic. The device is simple in structure and convenient to operate. In cooperation with various parameters, the fine detection for crack initiation and propagation of the rock specimen during loading process can be obtained, and plays an important role in evaluating the damage evolution degree of the rock specimen. The monitoring device can also be applied to the complex environment of the rock specimen with additional initial cracks and seepage field, and the application range is wide. The main skeleton and the sensor of the device can be reused, which provides help for crack detection and prediction in rock mass engineering.

BRIEF DESCRIPTION OF THE DRAWINGS

To describe the technical scheme in the embodiments of the present disclosure or in the prior art more clearly, the following briefly introduces the attached figures required for describing the embodiments. Apparently, the attached figures in the following description show merely some embodiments of the present disclosure, and those skilled in the art may still derive other attached figures from these attached figures without creative efforts.

Figure 1:
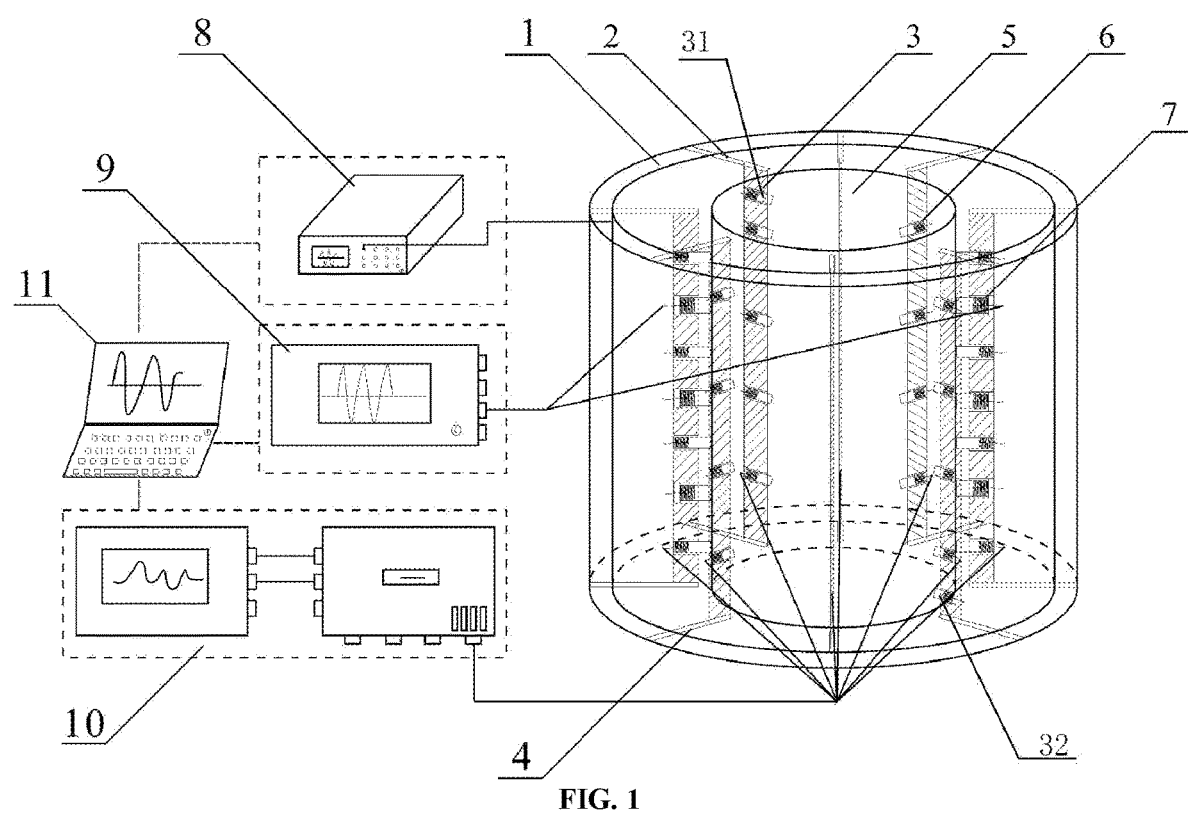
FIG. 1 is a total structural diagram of a device in the present disclosure.

Reference signs in the attached figures: 1, organic glass skeleton; 2, upper connector; 3, probe setter; 4, lower connector; 5, rock specimen; 6, electrode device; 6, sound emission probe device; 8, multi-channel distributed optical fiber sound wave acquisition module; 9, sound emission acquisition module; 10, parallel electrical acquisition module; 11, notebook computer; 12, pressure head device; 13, sound insulation protective cover; 14, bearing platform; 15, distributed optical fiber group; 16, jumper wire; 17, electrode groove; 18, test electrode; 19, electrode spring; 20, wire; 21, probe groove; 22, sound emission probe; 23, probe spring; 24, connecting wire; 25, first distributed optical fiber; 26, second distributed optical fiber; 27, third distributed optical fiber; 28, fourth distributed optical fiber; 29, fifth distributed optical fiber; 30, sixth distributed optical fiber; 31, B electrode; and 32, N electrode.

DETAILED DESCRIPTION OF THE EMBODIMENTS

The following clearly and completely describes the technical scheme in the embodiments of the present disclosure with reference to the attached figures in the embodiments of the present disclosure. Apparently, the described embodiments are merely a part rather than all of the embodiments of the present disclosure. Based on the embodiment in the present disclosure, all other embodiments obtained by the ordinary technical staff in the art under the premise of without contributing creative labor belong to the scope protected by the present disclosure.

The present disclosure aims to provide a fine detection device and method for crack initiation and propagation of a rock specimen during loading process. The whole testing process is dynamic. The device is simple in structure, convenient to operate and wide in application range. In cooperation with various parameters, the fine detection for crack initiation and propagation of the rock specimen during loading process can be obtained, and plays an important role in evaluating the damage evolution degree of the rock specimen and monitoring the complex environments of the rock specimen with additional initial cracks and seepage field.

To make the foregoing objective, features and advantages of the present disclosure clearer and more comprehensible, the present disclosure is further described in detail below with reference to the attached figures and specific embodiments.

The technical principle of the present disclosure is as follows:

1. Parallel Electrical Monitoring Principle

AM method is adopted, that is, the common ground electrode N and the negative electrode B of the common power supply electrode are separately arranged, and the n electrodes on the measuring line automatically take turns to serve as the power supply electrode A, and the remaining n−1 electrodes serve as the electrodes M. Therefore, the data of n electrode currents and (n−1)×n electrode potentials is obtained. Furthermore, the arrangement and combination apparent resistivity values of all electrode spacings in the n electrodes are obtained by using the three-electrode method.

$$\rho = \frac{2\pi}{\left(\frac{1}{AM} - \frac{1}{AN} - \frac{1}{BM} + \frac{1}{BN}\right)} * \frac{\Delta U}{I} = K\frac{\Delta U}{I} \quad \text{(Formula I)}$$

In the formula, ρ is the apparent resistivity, AM is the distance between the electrode A and the electrode M, AN is the distance between the electrode A and the electrode N, BM is the distance between the electrode B and the electrode M, BN is the distance between the electrode B and the electrode N, and K is the device coefficient.

Wherein, in the formula $$K = \frac{2\pi}{\frac{1}{AM} - \frac{1}{AN} - \frac{1}{BM} + \frac{1}{BN}}, \quad \text{(formula II)}$$

The three-electrode method refers to three electrodes A, M and N, and when the distance between M and N is very small, the formula II can be simplified as follows:

$$K = \frac{2\pi}{\frac{1}{AM} - \frac{1}{AN}} = \frac{2\pi AM \cdot AN}{MN} \quad \text{(Formula III)}$$

Namely, when MN is much smaller than AO (O is a middle point of MN), $$K = \frac{2\pi \overline{AO}^2}{MN} \quad \text{(Formula IV)}$$

$2\pi\overline{AO}^2$ is the horizontal distance area of two equipotential surfaces of M and N, and MN is the distance between the equipotential surfaces of M and N.

2. Sound Emission Monitoring Principle

When the loaded rock specimen 5 is damaged, the elastic wave signals released by the defects inside the specimen are propagated to the surface of the specimen through the interior of the specimen, resulting in weak vibration. These vibration signals are converted into electrical signals by the sound emission probe 22, and then amplified, processed and stored in a magnetic disk in the form of parameters or waveforms. The propagation form of the rock specimen 5 in the rock specimen 5 can be divided into longitudinal waves, transverse waves and surface waves.

2.1, Longitudinal Waves

The propagation direction of the longitudinal waves (P waves) is consistent with the vibration direction of mass points, and the expression of wave velocity is as follows:

$$v_p = \sqrt{\frac{E}{\rho} \frac{1-\sigma}{(1+\sigma)(1-2\sigma)}} \quad \text{(Formula V)}$$

In the formula, ρ is the density of the material, E is the elasticity modulus of the material, and σ is the Poisson ratio.

2.2, Transverse Waves

The propagation direction of the longitudinal waves (S waves) is consistent with the vibration direction of mass points, and the expression of wave velocity is as follows:

$$v_s = \sqrt{\frac{E}{\rho} \frac{1-\sigma}{2(1+\sigma)}} = \sqrt{\frac{G}{\rho}} \quad \text{(Formula VI)}$$

In the formula, G is the shear modulus of the material.

2.3, Sound Emission Attenuation

After the elastic waves are propagated in the medium for a certain distance, the signal intensity is decreased, and the amplitude of the attenuation type waveform has an exponential relationship with the propagation distance.

$$p(x) = p_0 e^{-\delta x} \quad \text{(Formula VII)}$$

In the formula, p(x) is the amplitude of the sound waves; x is the propagation distance of the sound waves; δ is the attenuation coefficient; and $p_0$ is the sound wave amplitude at the sound wave emission source.

3. DAS

When the optical fiber is subjected to external vibration, the optical fiber is stretched or compressed elastically. The stretching or compression of the optical fiber can cause the phase change of the backscattered Rayleigh light, and the phase change is proportional to the length change of the light. Therefore, by detecting the phase change of backscattered Rayleigh light signals, the information of optical fiber strain and external vibration can be calculated. The $\varepsilon_{mm}$ of the strain in the length direction of the optical fiber and the phase change of the backscattered Rayleigh light signals, Δφ optical fiber can be expressed as follows:

$$\Delta\varphi = n_c \frac{2\pi}{\lambda_1} \delta L = n_c L \varepsilon_{mm} \quad \text{(Formula VIII)}$$

Wherein, δL is the elongation of the gauge length of the optical fiber, $n_c$ is the refractive index of the optical fiber, and $\lambda_1$ is the laser wavelength. The optical fiber calibration degree is one of the most important parameters in distributed optical fiber technology. For DAS, the smaller the calibration degree of the optical fiber, the higher the measured spatial resolution is, but the signal-to-noise ratio of the signal is decreased. The larger the calibration degree of the optical fiber, the lower measured the spatial resolution is, but the signal-to-noise ratio of the signal is increased. The calibration length of the optical fiber of DAS can reach sub-meter level, thus providing the possibility of monitoring the sound sensing the distributed optical fiber of the rock specimen 5.

Figure 2:
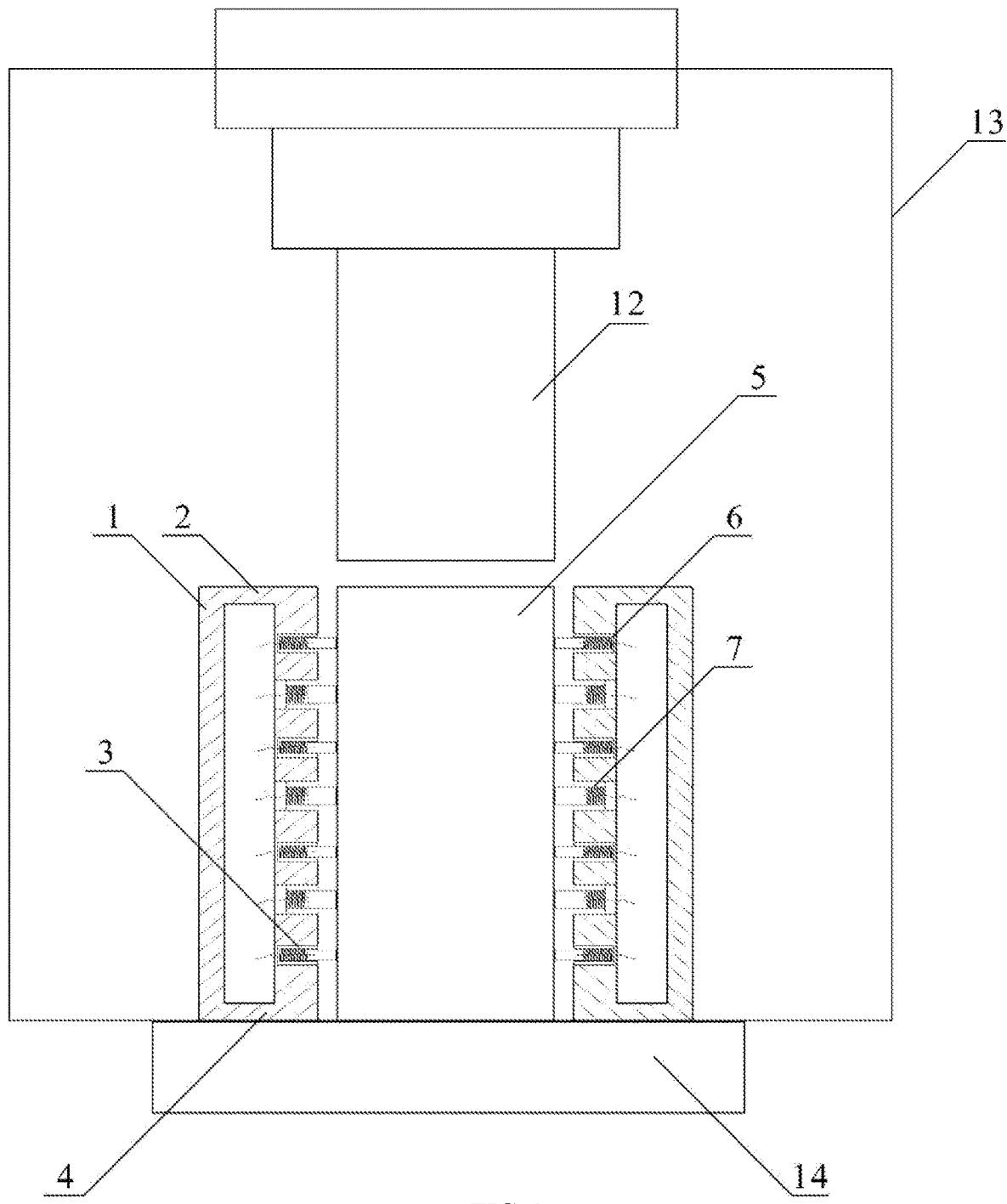
FIG. 2 is a vertical cross section of a device in an embodiment of the present disclosure.
Figure 3:
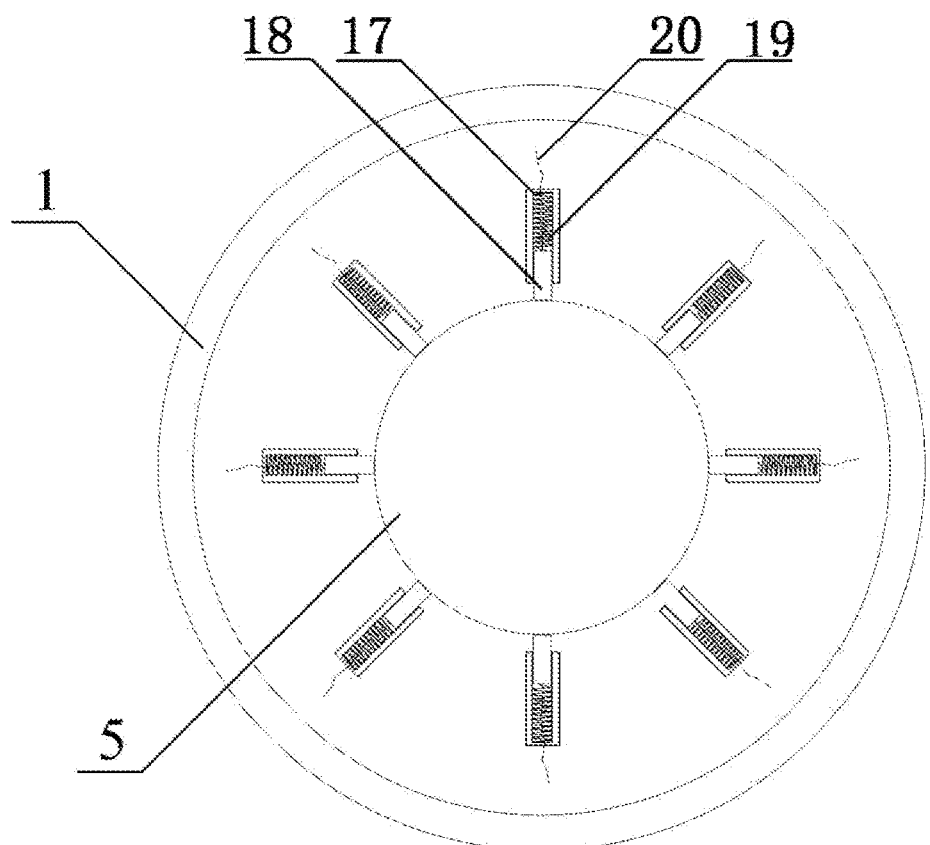
FIG. 3 is a horizontal profile of test electrodes.
Figure 4:
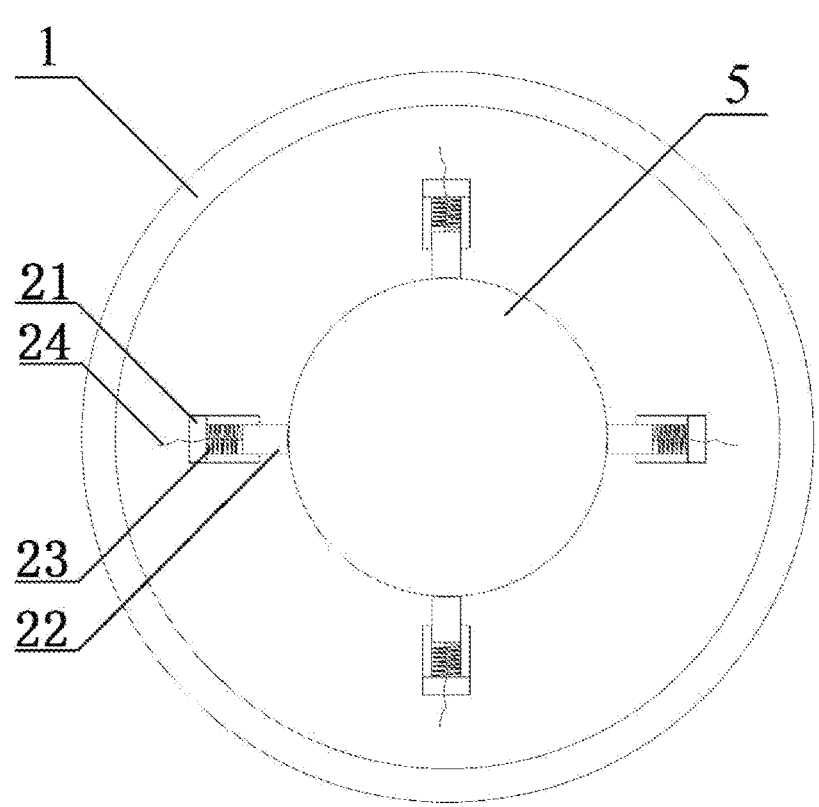
FIG. 4 is a horizontal profile of sound emission probes.
Figure 5:
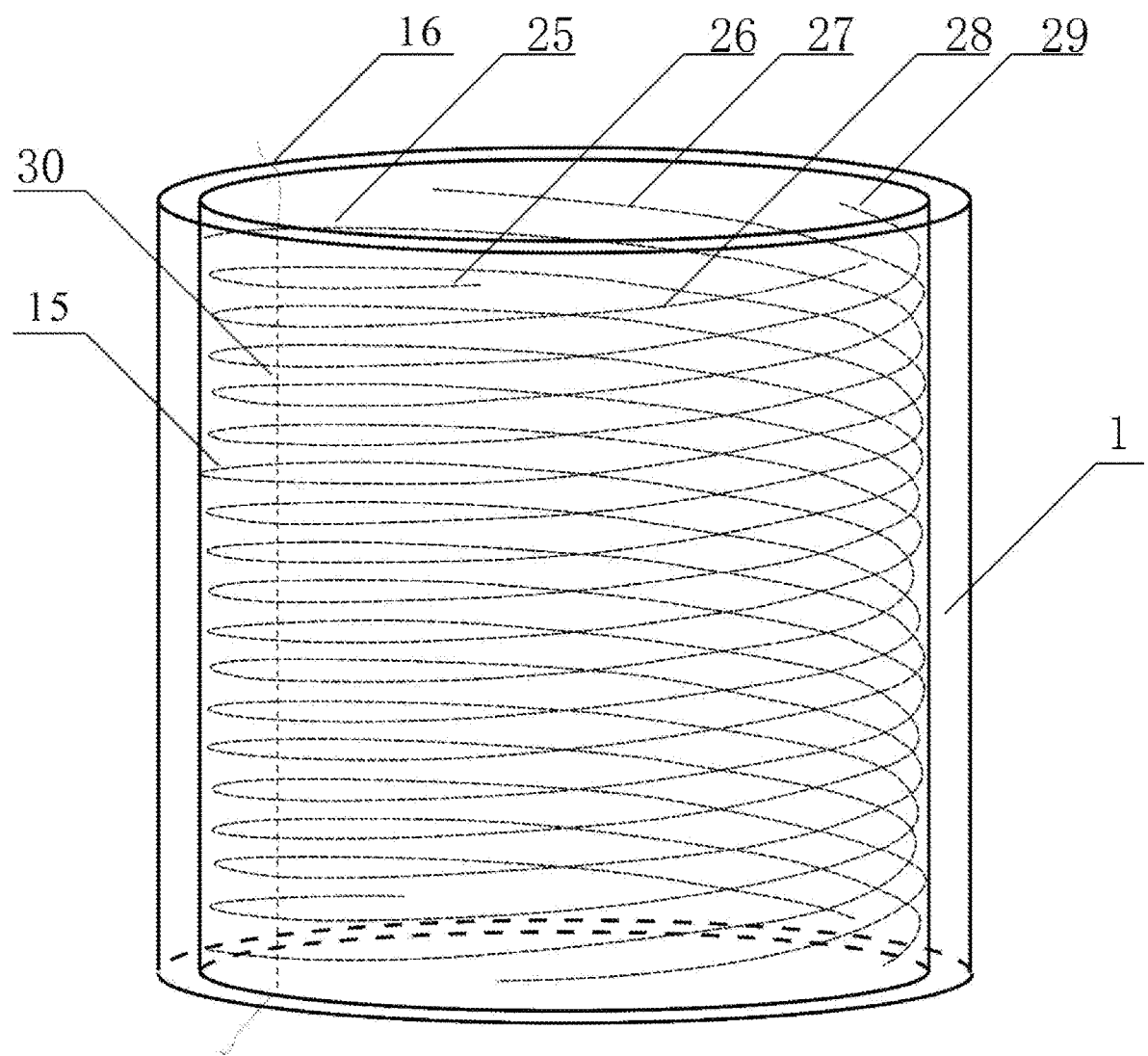
FIG. 5 is a layout mode of distributed optical fibers.
Figure 6:
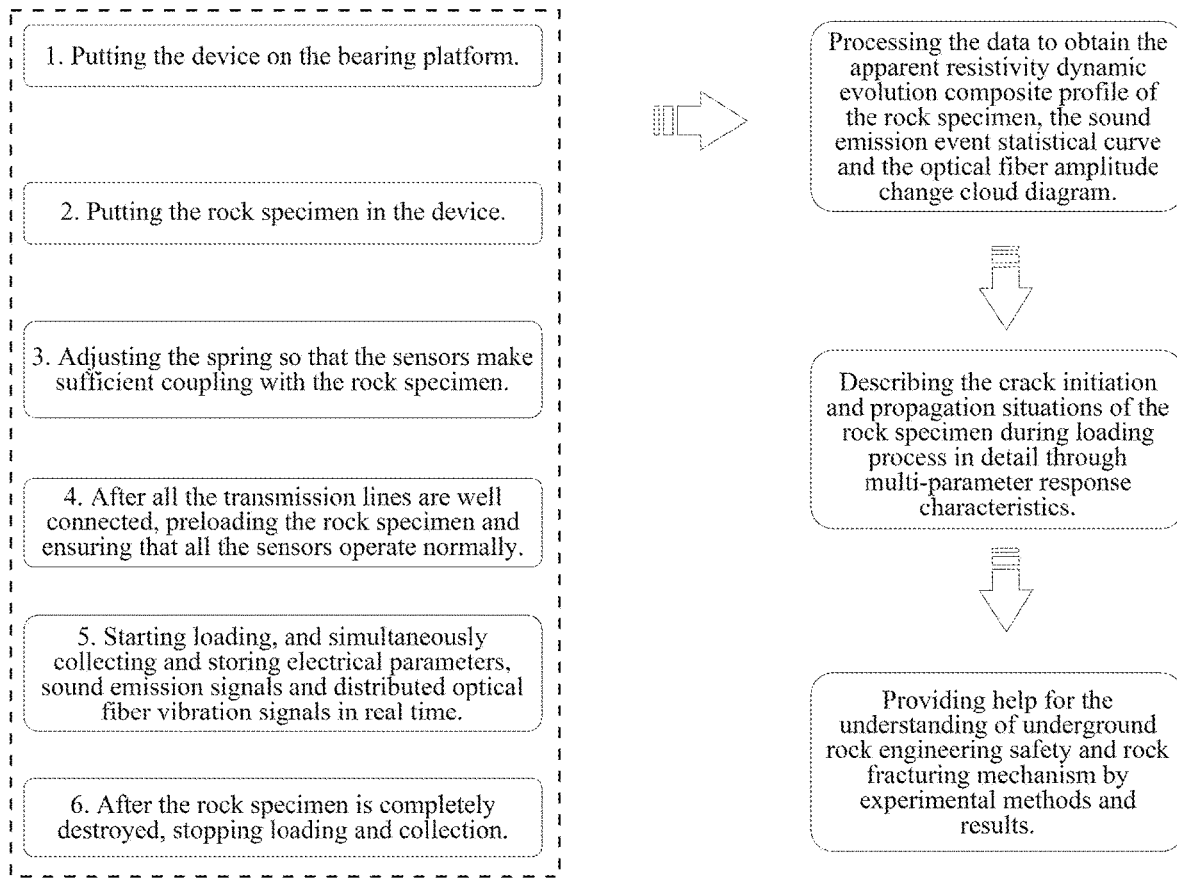
FIG. 6 is a flow chart of a method in an embodiment of the present disclosure.
Figure 1:
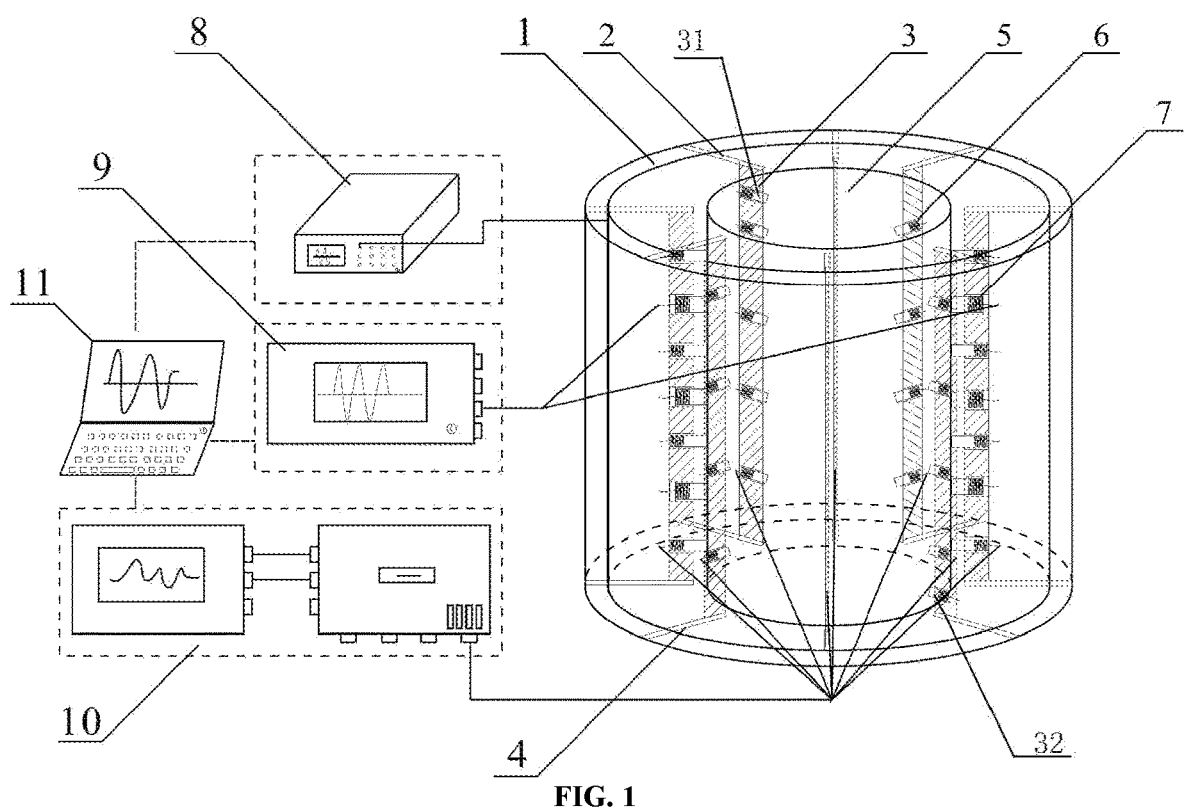
Figure 2:
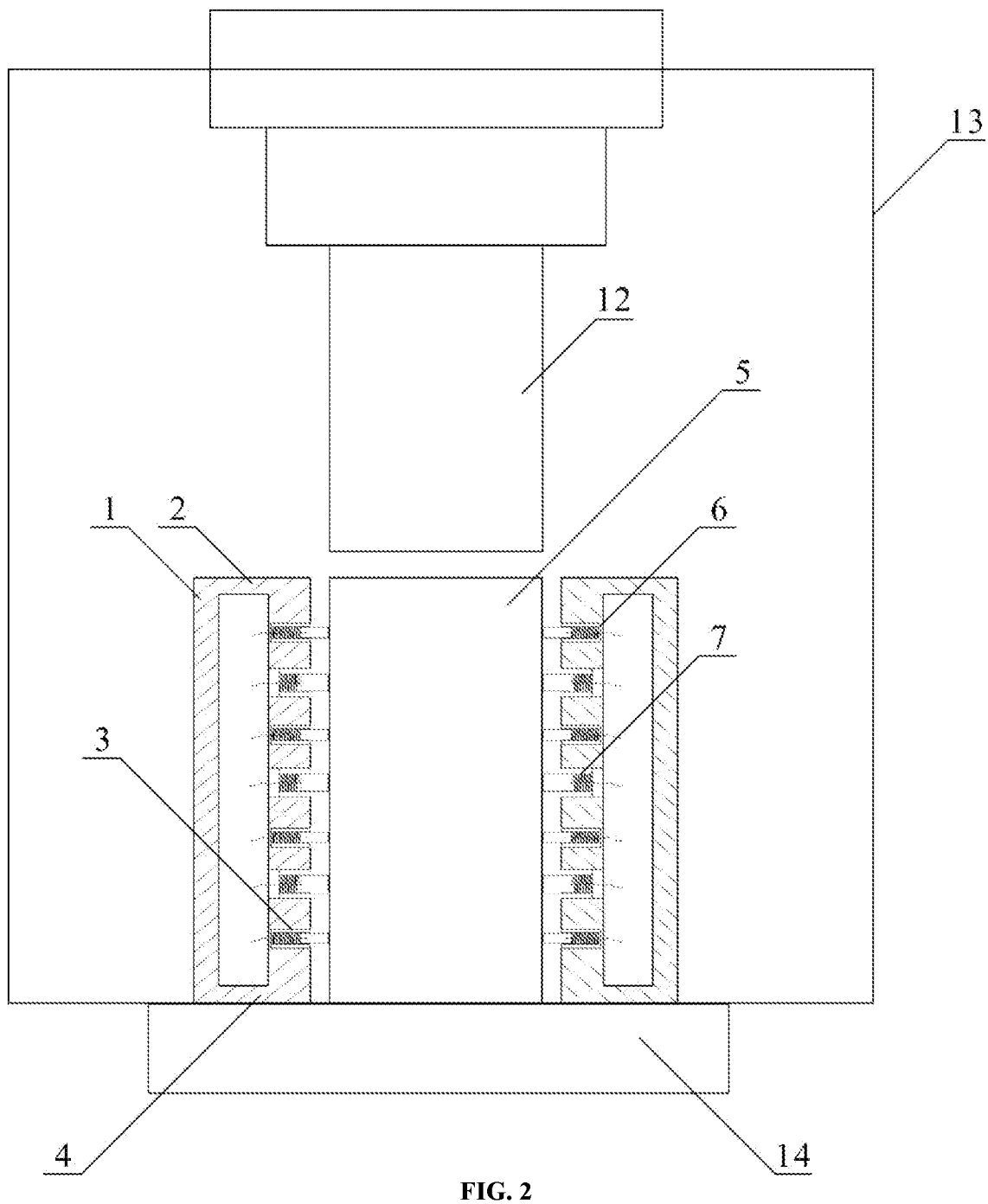
Figure 3:
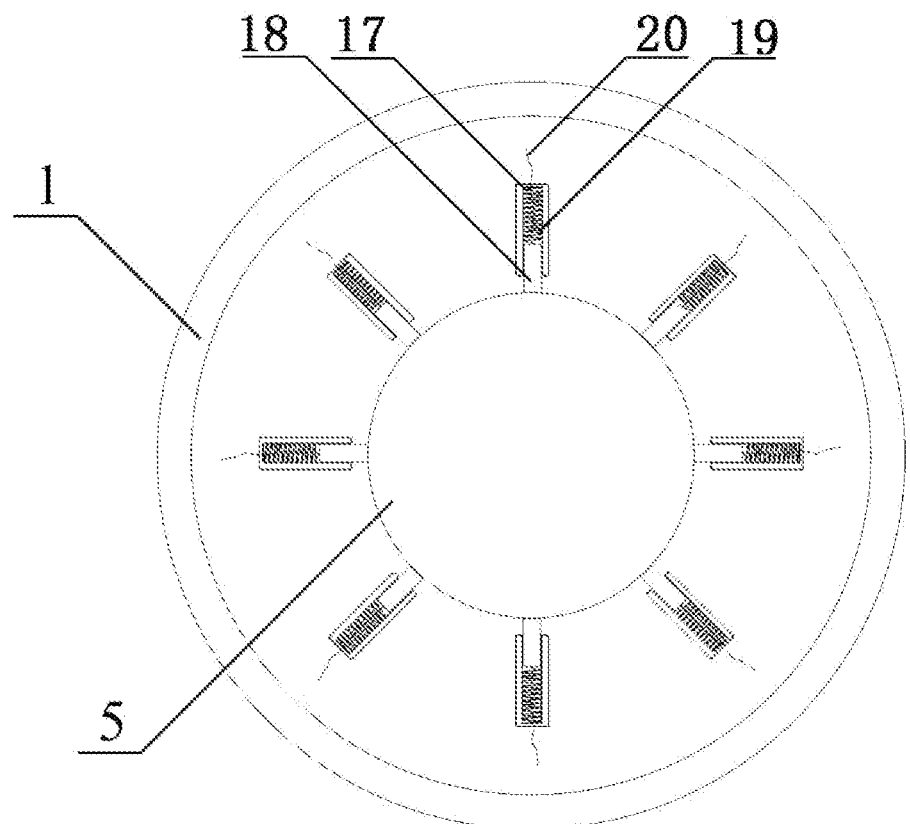
Figure 4:
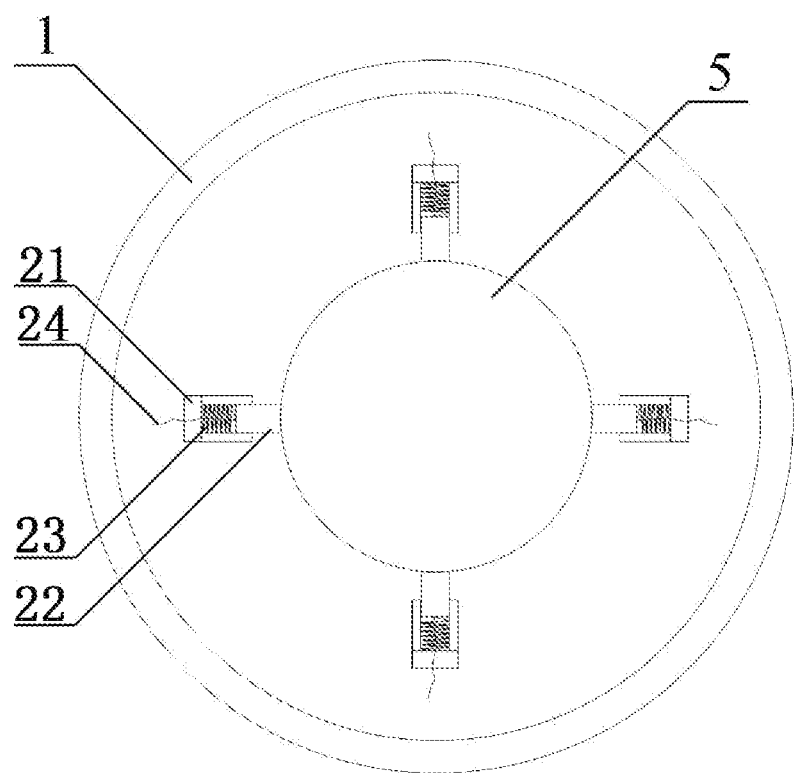
Figure 5:
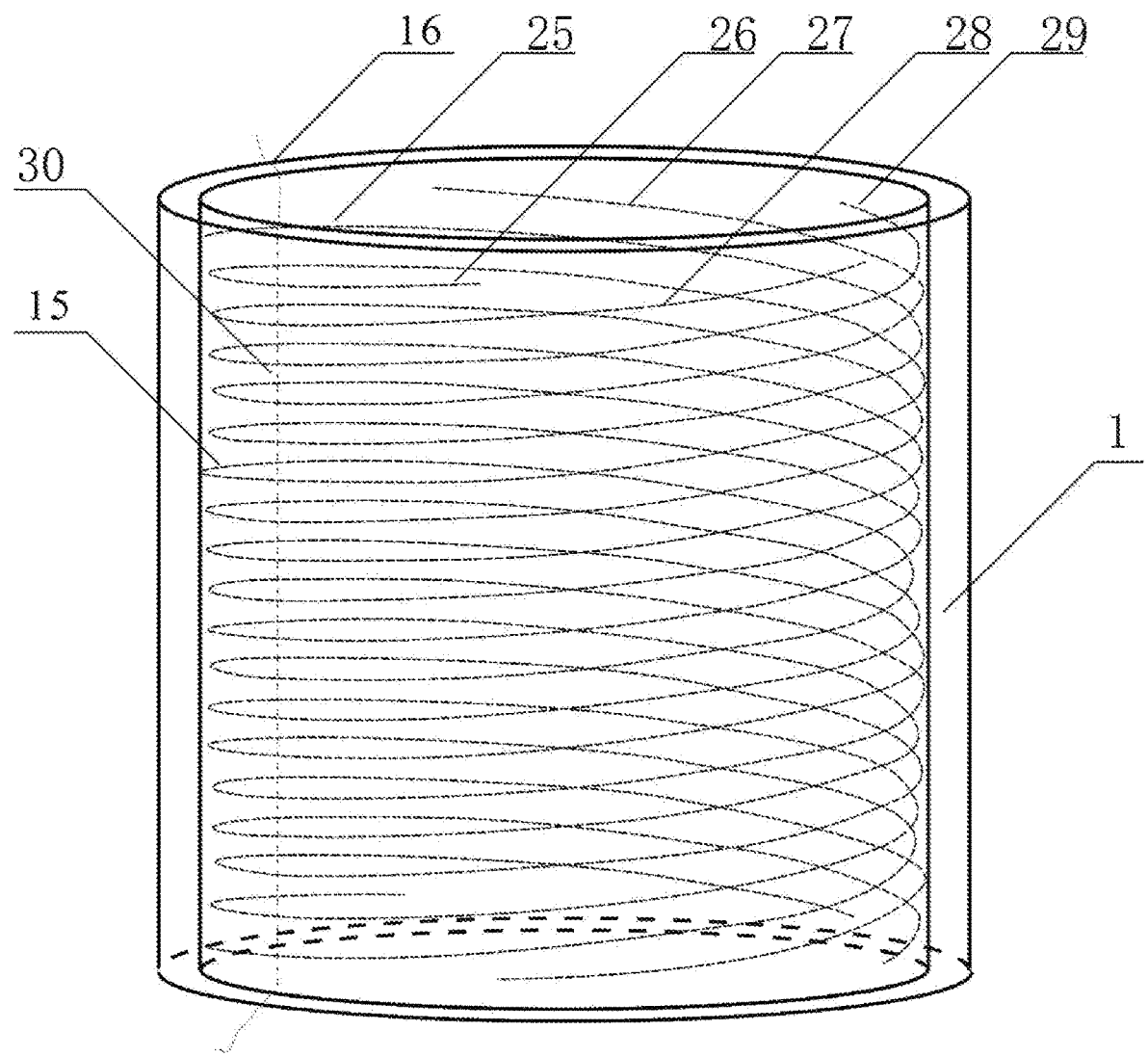
Figure 6:
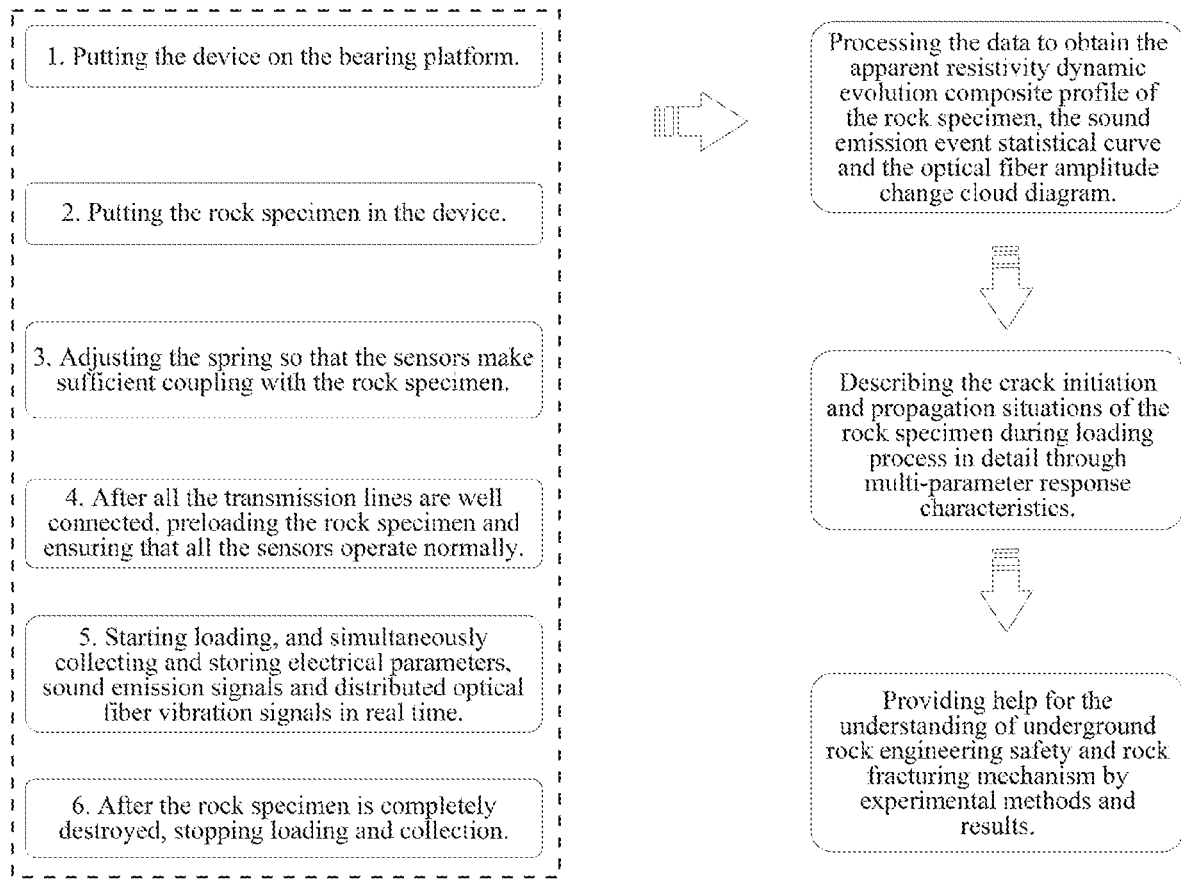

As shown in FIG. 1 and FIG. 2, a fine detection device for crack initiation and propagation of a rock specimen during loading process 5 provided by the embodiment of the present disclosure comprises an organic glass skeleton 1, a plurality of sensor support skeletons, an electrical parameter acquisition system, a sound emission signal acquisition system, a distributed optical fiber sound wave acquisition system, a servo press bearing platform 14 and a computer 11. The organic glass skeleton 1 is placed in the middle of the servo press bearing platform 14. The sensor support skeletons are arranged inside the organic glass skeleton 1. The rock specimen 5 is arranged inside the sensor support skeleton. The electrical parameter acquisition system and the sound emission signal acquisition system are fixedly arranged on the sensor support skeleton. The distributed optical fiber sound wave acquisition system is fixedly arranged on the inner wall of the organic glass skeleton 1. The electrical parameter acquisition system, the sound emission signal acquisition system and the distributed optical fiber sound wave acquisition system are in contact with the rock specimen 5. The electrical parameter acquisition system, the sound emission signal acquisition system and the distributed optical fiber sound wave acquisition system are electrically connected to the computer 11.

The electrical parameter acquisition system is used for collecting the parameter variation characteristics of the rock specimen 5 in the loading and fracturing process.

The sound emission signal acquisition system is used for acquiring the spatial position generated by the internal fracture of the loaded rock specimen 5.

The distributed optical fiber sound wave acquisition system is used for determining the intensity of vibration and the three-dimensional spatial position.

The servo press bearing platform 14 is composed of a pressure head device 12 and a bearing platform 14. The bearing platform 14 is provided with the organic glass skeleton 1. The pressure head device 12 is arranged just above the central axis of the organic glass skeleton 1.

The eight sensor support skeletons are respectively uniformly arranged in the organic glass skeleton 2. The sensor support skeleton comprises an upper connector 2, probe setters 3 and a lower connector 4. The organic glass skeleton 1 is in a hollow cylindrical shape. The upper connectors 2 are equidistantly arranged on the upper side inside the organic glass skeleton 1. The lower connectors 4 are arranged on the lower side inside the organic glass skeleton 1 corresponding to the upper connectors 2. The probe setters 3 are arranged between the upper connector 2 and the lower connector 4. The probe setter 3 is rectangular. The electrical parameter acquisition system is fixedly arranged on the eight probe setters 3. The sound emission signal acquisition system is fixedly arranged on the four uniformly distributed probe setters 3. The main chemical component of the organic glass skeleton and the probe setter 3 is polymethyl methacrylate, and the upper connector 2, the probe setter 3 and the lower connector 4 are made of rigid plastic.

The electrical parameter acquisition system comprises a parallel electrical acquisition module 10, test electrodes 18, a B electrode 31, an N electrode 32 and electrode springs 19. There are thirty-two test electrodes 18, one B electrode 31 and one N electrode 32. Four electrode grooves are uniformly arranged in the probe setter. The top of one probe setter is additionally provided with an electrode groove 17 for placing the B electrode 31, and the bottom of the other probe setter opposite to the probe setter is additionally provided with an electrode groove 17 for placing the N electrode 32. The electrode spring 19 is arranged in the electrode groove 17. The top of the electrode spring 19 is provided with the test electrode 18, the B electrode 31 and the N electrode 32. The test electrode 18, the B electrode 31 and the N electrode 32 are in contact with the rock specimen 5. The contact surfaces of the test electrode 18, the B electrode 31 and the N electrode 32 with the rock specimen 5 are curved surfaces with the same curvature as that of the rock specimen 5. The test electrode 18, the B electrode 31 and the N electrode 32 are electrically connected with the parallel electrical acquisition module 10. The parallel electrical acquisition module 10 is electrically connected to the computer 11. The test electrode 18 and the electrode spring 19 are annularly arranged in the electrode groove 17. There are eight test electrodes 18 and eight electrode springs 19 are arranged on each circumference, forming an annular measuring line. Four annular measuring lines are arranged on the whole device. Each annular measuring line of the electrode device 6 can be independently measured to form a circular testing profile. The distribution of three-dimensional electrical parameters can also be obtained through joint test. According to the variation characteristics of the parameters such as spontaneous potential, excitation current, excitation potential and apparent resistivity in the loading and fracturing process of the rock specimen 5, the initiation and propagation of cracks inside and on the surface of the rock specimen 5 can be obtained.

The sound emission signal acquisition system comprises sound emission probes 22, probe springs 23 and a sound emission acquisition module 9. The sound emission probe 22 and the probe spring 23 are annularly arranged in the probe groove 21. There are four sound emission probes 22 and four probe spring 23 are arranged on each circumference. There are twelve channels for the sound emission probes 22 in all. The probe spring 23 is arranged in the probe groove 21. The top of the probe spring 23 is provided with the sound emission probe 22. The sound emission probe 22 is in contact with the rock specimen 5. The contact surface between the sound emission probe 22 and the rock specimen 5 is a curved surface with the same curvature as that of the rock specimen 5. The sound emission probe 22 is electrically connected to the sound emission acquisition module 9 through a connecting wire 24. The sound emission acquisition module 9 is electrically connected to the computer 11. The device 7 of the sound emission probe 22 records and stores the rock fracture events in real time. By processing the sound emission data, the spatial positions of the cracks in the loaded rock specimen 5 can be obtained, and then the evolution of the cracks can be obtained.

The electrode spring 19 and the probe spring 23 are uniformly coated with a layer of insulating paint.

The distributed optical fiber sound wave acquisition system comprises a multi-channel distributed optical fiber sound wave acquisition module 8 and a distributed optical fiber group 15. There are six distributed optical fibers in the distributed optical fiber group 15. The first to the fifth distributed optical fiber are equidistantly spirally arranged on the inner wall of the organic glass skeleton. The sixth distributed optical fiber 30 is vertically arranged on the inner wall of the organic glass skeleton. The distributed optical fiber is a bare fiber coated with only one layer of an optical fiber material, and the diameter is about 100 μm. The first to the sixth distributed optical fiber are respectively electrically connected to the multi-channel distributed optical fiber sound wave acquisition module 8. The multi-channel distributed optical fiber sound wave acquisition module 8 is electrically connected to the computer 11. The distributed optical fiber group 15 monitors the vibration signal through the phase change caused by the vibration, and the intensity of the vibration and the three-dimensional spatial position can be determined by the cooperation of the multiple optical fibers, and then the initiation and propagation of the cracks inside and on the surface of the rock specimen 5 are obtained.

A sound insulation protective cover 13 is installed outside the device for insulating external noise interference and protecting testers.

The embodiment of the present disclosure further provides a fine detection method for crack initiation and propagation of a rock specimen during loading process, applied to the fine detection device for crack initiation and propagation of a rock specimen during loading process, comprising the following steps.

Step one, putting sensor support skeletons and a multi-parameter dynamic acquisition system on a servo press bearing platform 14, putting a standard rock specimen 5 inside a device, enabling a test electrode 18 and a sound emission probe 22 to be in close contact with the rock specimen 5 by adjusting a spring, uniformly smearing conducting resin between the test electrode 18 and the rock specimen 5 when necessary, uniformly smearing Vaseline between the sound emission probe 22 and the rock specimen 5 to enhance coupling, and placing a sound insulation protective cover 13.

Step two, connecting all transmission lines, starting a servo press to be in pre-contact with the rock specimen 5, and then starting the pre-acquisition and pre-processing of data to ensure that each sensor is in an effective working state.

Step three, loading the rock specimen 5, and simultaneously recording and storing the data in real time; and acquiring the real-time change situation of the resistivity of four circular electrical sections from top to bottom through the collection of electrical parameters, wherein when cracks appear in the rock specimen 5, the corresponding performance is high resistance; through the collection of sound emission data, the fracturing spatial position and time of the rock specimen 5 are acquired; through the collection of distributed optical fiber sound waves, the vibration signal during rock fracturing is acquired; through the cooperation of multiple optical fibers, the location of fracture position and crack size of the loaded rock specimen 5 is realized.

Step four, through single-field parameter analysis method, multi-field parameter conjoint analysis method and digital rock core reconstruction method based on field parameters, mapping and analyzing each parameter, and finely identifying the crack propagation of the rock specimen.

In order to enhance the image capture of the deformation and failure of the rock specimen 5, a high-speed camera or 3D-DIC camera can be appropriately added to record the whole fracturing process.

For an embodiment of the present disclosure, the single-field parameter analysis method is specifically as follows.

The electrode current (I) of the standard rock specimen is analyzed. The standard rock specimen 5 with the diameter of 50 mm and the height of 100 mm is put in the device. The servo press bearing platform is used for loading, and the axial loading rate is controlled to be 0.1 kN/s until the rock specimen 5 is completely destroyed. The consumed time of the loading process is t, and the servo press bearing platform can record the change of axial pressure (F) in the whole loading process. During the period of time (t), the electrode current (I) is continuously collected to obtain the change of the electrode current (I) in the whole loading process. A graph is drawn by taking time (t) as the x axis, the axial pressure (F) and the electrode current (I) of the rock specimen as the double y axes, the time-force-electrode current response curve is obtained, which provides help for the analysis of the rock crack propagation mechanism according to the sudden change of a certain parameter. Similarly, the time-force-resistivity curve, time-force-spontaneous potential curve, time-force-excitation potential curve, time-force-strain curve, time-force-sound wave amplitude curve and time-force-sound emission parameter curve can be obtained, and the crack change mechanism of the loaded rock specimen can be finely identified from different parameter angles.

For an embodiment of the present disclosure, the multi-field parameter conjoint analysis method is specifically as follows.

The standard rock specimen 5 with the diameter of 50 mm and the height of 100 mm is put in the device. The servo press bearing platform is used for loading, and the axial loading rate is controlled to be 0.1 kN/s until the rock specimen 5 is completely destroyed. The consumed time of the loading process is t, and the servo press bearing platform can record the change of axial pressure (F) in the whole loading process. A multi-parameter testing device can obtain the resistivity ($\rho$), spontaneous potential ($\varphi$), electrode current (I), electrode potential (U), sound wave amplitude (D) and sound emission event count (n) of the rock specimen 5 in the whole loading process. Correlation analysis between two parameters is carried out on the electrode current (I) and the sound emission event count (n) to obtain the continuous change data of the electrode current (I) and the sound emission event count (n) at a certain loading moment t of measuring points. The electrode current (I) is taken as the x coordinate and the sound emission event count (n) is taken as the y coordinate to get points, and then curve fitting is carried out to obtain the correlation curve of the electrode current (I) and the sound emission event count (n), so that the identification basis is provided for the crack initiation and propagation of the loaded rock specimen according to the slope of a fitted curve.

Correlation analysis among three parameters is carried out on the electrode current (I), the sound wave amplitude (D) and the sound emission event count (n). The electrode current (I) is taken as the x coordinate, the sound wave amplitude (D) is taken as the y coordinate and the sound emission event count (n) is take as the z coordinate to get points, and then surface fitting is carried out to obtain a response relation curved surface based on three parameters, so that the identification basis is provided for the crack initiation and propagation of the loaded rock specimen according to the curvature radius of a fitting surface.

For the correlation analysis among more than three parameters, based on SPASS software, multiple linear regression analysis or multiple nonlinear regression analysis is carried out, and through the conjoint analysis of multiple parameters, a reference is provided for fine detection of the initiation and propagation of cracks in the rock specimen.

For an embodiment of the present disclosure, the digital rock core reconstruction method based on field parameters is specifically as follows.

The standard rock specimen 5 with the diameter of 50 mm and the height of 100 mm is put in the device. The servo press bearing platform is used for loading, and the axial loading rate is controlled to be 0.1 kN/s until the rock specimen 5 is completely destroyed. The consumed time of the loading process is t, and the servo press bearing platform can record the change of axial pressure (F) in the whole loading process. During the period of time (t), the electrode current (I) is continuously collected to obtain the change of the electrode current (I) in the whole loading process. Through continuous testing, the distribution situations of the lithologic electrode current at different moments are obtained. For example, the electrode current corresponding to the measuring point $(x_1, y_1, z_1)$ is $I_1$, the resistivity corresponding to the measuring point $(x_2, y_2, z_2)$ is $I_2, \ldots$, and the electrode current corresponding to the measuring point $(x_m, y_m, z_m)$ is $I_m$. Accordingly, the spatial distribution situation of the rock core electrode current value at a certain loading moment, that is, the digital rock core electrode current value at a certain loading moment, can be obtained, and different digital rock core electrode current values can be obtained by taking different loading moments. Similarly, models such as digital rock core resistivity and digital rock core spontaneous potential can be obtained. The crack initiation and propagation situations of the rock specimen during loading process can be intuitively observed through the digital rock core. At the same time, the establishment of the digital rock core database of big data geophysical parameters can provide help for crack prediction of the loaded rock core.

The data processing and analysis method is as follows.

Firstly, in the comparative analysis of multi-field test results, the electrical parameter, sound emission parameter, stress parameter and magnetic parameter of the rock specimen 5 in the fracturing process can be obtained through the present disclosure, and the response process of hydraulic fracturing parameters of the rock specimen 5 can be described from four different field parameters. With the time variable as the common variable, the conjoint response characteristic curves of four parameters can be obtained by Origin software. The response characteristics of different parameters in different loading and fracturing stages of the rock specimen are different. By constructing a multi-parameter evaluation system, the response characteristics of hydraulic fracturing field parameters of the rock specimen 5 in each stage can be sensitively captured.

Secondly, in the comparative analysis of response characteristics among parameters, when multi-field parameters are obtained, certain correlation exists among the field parameters, and the correlation degree among the field parameters can be further known through the correlation analysis among parameters constructed by SPASS. The correlation analysis method comprises neural network, regression analysis, variance analysis, conjoint analysis and the like. By constructing correlation analysis among parameters, the conjoint response mechanism among parameters can be further understood.

Thirdly, in the predictive analysis, the device in the present disclosure is helpful to obtain parameter response characteristics and fracture precursor information in real time through multi-dimensional and multi-parameter collaborative testing of the rock specimen 5 during loading process. On the multi-scale and multi-parameter basis, according to massive monitoring data, mathematical modeling and prediction can be carried out on the crack propagation and penetration of the rock specimen 5. The predictive analysis plays an important role in predicting the occurrence of rupture.

Fourthly, in the construction of dynamically deformed and destroyed digital rock core, the three-dimensional distribution of fracture field can be obtained through multi-field collaborative tests, for example, the three-dimensional distribution of the electrical parameters of the rock specimen 5 can be obtained by electrical tests. According to the scanning or parameter test results, the three-dimensional digital rock core can be constructed. The construction of the three-digit rock core can be the construction of the single parameter or the construction after data fusion. Through the construction of the digital rock core, the visualization degree of the deformation damage and crack initiation and propagation of the rock specimen 5 is greatly improved.

The fine detection device and method for crack initiation and propagation of a rock specimen during loading process provided by the present disclosure realize the parameters such as resistivity profile, natural potential, current, potential, sound emission events, optical fiber vibration signals and the like in the damage process of the rock specimen under uniaxial loading conditions. The whole testing process is dynamic. The device is simple in structure and convenient to operate. In cooperation with various parameters, the fine detection for crack initiation and propagation of the rock specimen during loading process can be obtained, and plays an important role in evaluating the damage evolution degree of the rock specimen. The monitoring device can also be applied to the complex environment of the rock specimen with additional initial cracks and seepage field, and the application range is wide. The main skeleton and the sensor of the device can be reused, which provides help for crack detection and prediction in rock mass engineering.

Several examples are used for illustration of the principles and implementation methods of the present disclosure. The description of the embodiments is used to help illustrate the method and the core principles of the present disclosure; and meanwhile, those skilled in the art can make various modifications in terms of specific embodiments and scope of application in accordance with the teachings of the present disclosure. In conclusion, the content of this specification shall not be construed as a limitation to the present disclosure.

What is claimed is:

1. A fine detection device for crack initiation and propagation of a rock specimen during loading process, comprising an organic glass skeleton, a plurality of sensor support skeletons, an electrical parameter acquisition system, a sound emission signal acquisition system, a distributed optical fiber sound wave acquisition system, a servo press bearing platform and a computer, wherein the organic glass skeleton is placed in the middle of the servo press bearing platform, the sensor support skeletons are arranged inside the organic glass skeleton, the rock specimen is arranged inside the sensor support skeleton, the electrical parameter acquisition system and the sound emission signal acquisition system are fixedly arranged on the sensor support skeleton, the distributed optical fiber sound wave acquisition system is fixedly arranged on the inner wall of the organic glass skeleton, the electrical parameter acquisition system, the sound emission signal acquisition system and the distributed optical fiber sound wave acquisition system are in contact with the rock specimen, and the electrical parameter acquisition system, the sound emission signal acquisition system and the distributed optical fiber sound wave acquisition system are electrically connected to the computer;

the electrical parameter acquisition system is used for collecting the parameter variation characteristics of the rock specimen in the loading and fracturing process;

the sound emission signal acquisition system is used for acquiring the spatial position generated by the internal fracture of the loaded rock specimen; and the distributed optical fiber sound wave acquisition system is used for determining the intensity of vibration and the three-dimensional spatial position.

2. The fine detection device for crack initiation and propagation of a rock specimen during loading process according to claim 1, wherein the servo press bearing platform is composed of a pressure head device and a bearing platform, the bearing platform is provided with the organic glass skeleton, and the pressure head device is arranged just above the central axis of the organic glass skeleton.

3. The fine detection device for crack initiation and propagation of a rock specimen during loading process according to claim 2, wherein the eight sensor support skeletons are respectively uniformly arranged in the organic glass skeleton, the sensor support skeleton comprises an upper connector, probe setters and a lower connector, the organic glass skeleton is in a hollow cylindrical shape, the upper connectors are equidistantly arranged on the upper side inside the organic glass skeleton, the lower connectors are arranged on the lower side inside the organic glass skeleton corresponding to the upper connectors, the probe setters are arranged between the upper connector and the lower connector, the probe setter is rectangular, the electrical parameter acquisition system is fixedly arranged on the eight probe setters, and the sound emission signal acquisition system is fixedly arranged on the four uniformly distributed probe setters.

4. The fine detection device for crack initiation and propagation of a rock specimen during loading process according to claim 3, wherein the electrical parameter acquisition system comprises a parallel electrical acquisition module, test electrodes, a B electrode, an N electrode and electrode springs, there are thirty-two test electrodes, one B electrode and one N electrode, four electrode grooves are uniformly arranged in the probe setter, the top of one probe setter is additionally provided with an electrode groove for placing the B electrode, the bottom of the other probe setter opposite to the probe setter is additionally provided with an electrode groove for placing the N electrode, the electrode spring is arranged in the electrode groove, the top of the electrode spring is provided with the test electrode, the B electrode and the N electrode, the test electrode, the B electrode and the N electrode are in contact with the rock specimen, the contact surfaces of the test electrode, the B electrode and the N electrode with the rock specimen are curved surfaces with the same curvature as that of the rock specimen, the test electrode, the B electrode and the N electrode are electrically connected with the parallel electrical acquisition module, and the parallel electrical acquisition module is electrically connected to the computer.

5. The fine detection device for crack initiation and propagation of a rock specimen during loading process according to claim 3, wherein the sound emission signal acquisition system comprises sound emission probes, probe springs and a sound emission acquisition module, three probe grooves are uniformly arranged in the probe setter, the probe spring is arranged in the probe groove, the top of the probe spring is provided with the sound emission probe, the sound emission probe is in contact with the rock specimen, the contact surface between the sound emission probe and the rock specimen is a curved surface with the same curvature as that of the rock specimen, the sound emission probe is electrically connected to the sound emission acquisition module, and the sound emission acquisition module is electrically connected to the computer.

6. The fine detection device for crack initiation and propagation of a rock specimen during loading process according to claim 3, wherein the distributed optical fiber sound wave acquisition system comprises a multi-channel distributed optical fiber sound wave acquisition module and a distributed optical fiber group, there are six distributed optical fibers in the distributed optical fiber group, the first to the fifth distributed optical fiber are equidistantly spirally arranged on the inner wall of the organic glass skeleton, the sixth distributed optical fiber is vertically arranged on the inner wall of the organic glass skeleton, the distributed optical fiber is a bare fiber coated with only one layer of an optical fiber material, the first to the sixth distributed optical fiber are respectively electrically connected to the multi-channel distributed optical fiber sound wave acquisition module, and the multi-channel distributed optical fiber sound wave acquisition module is electrically connected to the computer.

7. A fine detection method for crack initiation and propagation of a rock specimen during loading process, applied to the fine detection device for crack initiation and propagation of a rock specimen during loading process according to claim 1, comprising the following steps:

step one, putting a standard rock specimen inside a device, and enabling a test electrode and a sound emission probe to be in close contact with the rock specimen by adjusting a spring;

step two, connecting all transmission lines, starting a pressure head device to be in pre-contact with the rock specimen, and then starting the pre-acquisition and pre-processing of data to ensure that each sensor is in an effective working state;

step three, loading the rock specimen, and acquiring the real-time change situation of the resistivity of four circular electrical sections from top to bottom through the collection of electrical parameters, wherein when cracks appear in the rock specimen, the corresponding performance is high resistance; through the collection of sound emission data, the fracturing spatial position and time of the rock specimen are acquired; through the collection of distributed optical fiber sound waves, the vibration signal during rock fracturing is acquired; through the cooperation of multiple optical fibers, the location of fracture position and crack size of the loaded rock specimen is realized, and at the same time, the data is recorded and stored in real time; and step four, through single-field parameter analysis method, multi-field parameter conjoint analysis method and digital rock core reconstruction method based on field parameters, mapping and analyzing each parameter, and finely identifying the crack propagation of the rock specimen.

8. The fine detection method for crack initiation and propagation of a rock specimen during loading process according to claim 7, wherein the servo press bearing platform is composed of a pressure head device and a bearing platform, the bearing platform is provided with the organic glass skeleton, and the pressure head device is arranged just above the central axis of the organic glass skeleton.

9. The fine detection method for crack initiation and propagation of a rock specimen during loading process according to claim 8, wherein the eight sensor support skeletons are respectively uniformly arranged in the organic glass skeleton, the sensor support skeleton comprises an upper connector, probe setters and a lower connector, the organic glass skeleton is in a hollow cylindrical shape, the upper connectors are equidistantly arranged on the upper side inside the organic glass skeleton, the lower connectors are arranged on the lower side inside the organic glass skeleton corresponding to the upper connectors, the probe setters are arranged between the upper connector and the lower connector, the probe setter is rectangular, the electrical parameter acquisition system is fixedly arranged on the eight probe setters, and the sound emission signal acquisition system is fixedly arranged on the four uniformly distributed probe setters.

10. The fine detection method for crack initiation and propagation of a rock specimen during loading process according to claim 9, wherein the electrical parameter acquisition system comprises a parallel electrical acquisition module, test electrodes, a B electrode, an N electrode and electrode springs, there are thirty-two test electrodes, one B electrode and one N electrode, four electrode grooves are uniformly arranged in the probe setter, the top of one probe setter is additionally provided with an electrode groove for placing the B electrode, the bottom of the other probe setter opposite to the probe setter is additionally provided with an electrode groove for placing the N electrode, the electrode spring is arranged in the electrode groove, the top of the electrode spring is provided with the test electrode, the B electrode and the N electrode, the test electrode, the B electrode and the N electrode are in contact with the rock specimen, the contact surfaces of the test electrode, the B electrode and the N electrode with the rock specimen are curved surfaces with the same curvature as that of the rock specimen, the test electrode, the B electrode and the N electrode are electrically connected with the parallel electrical acquisition module, and the parallel electrical acquisition module is electrically connected to the computer.

11. The fine detection method for crack initiation and propagation of a rock specimen during loading process according to claim 10, wherein in the step four, the single-field parameter analysis method is specifically as follows:

the single-field parameter analysis method refers to the analysis of the response of a certain parameter in combination with the time-force curve of loading, and the common variable is time: the standard rock specimen is placed in the device, and a servo device is used for loading until the standard rock specimen is completely destroyed; the whole recording time in the loading and fracturing process of the rock specimen, axial pressure and parameters to be analyzed are continuously collected; the time is taken as the x axis, the axial pressure and the corresponding parameters to be analyzed are taken as the double y axes to draw a graph, so that the corresponding response curve can be obtained; and then, according to the sudden change of the parameter, a basis is provided for the analysis of the rock crack propagation mechanism.

12. The fine detection method for crack initiation and propagation of a rock specimen during loading process according to claim 9, wherein the sound emission signal acquisition system comprises sound emission probes, probe springs and a sound emission acquisition module, three probe grooves are uniformly arranged in the probe setter, the probe spring is arranged in the probe groove, the top of the probe spring is provided with the sound emission probe, the sound emission probe is in contact with the rock specimen, the contact surface between the sound emission probe and the rock specimen is a curved surface with the same curvature as that of the rock specimen, the sound emission probe is electrically connected to the sound emission acquisition module, and the sound emission acquisition module is electrically connected to the computer.

13. The fine detection method for crack initiation and propagation of a rock specimen during loading process according to claim 12, wherein in the step four, the single-field parameter analysis method is specifically as follows:

the single-field parameter analysis method refers to the analysis of the response of a certain parameter in combination with the time-force curve of loading, and the common variable is time: the standard rock specimen is placed in the device, and a servo device is used for loading until the standard rock specimen is completely destroyed; the whole recording time in the loading and fracturing process of the rock specimen, axial pressure and parameters to be analyzed are continuously collected; the time is taken as the x axis, the axial pressure and the corresponding parameters to be analyzed are taken as the double y axes to draw a graph, so that the corresponding response curve can be obtained; and then, according to the sudden change of the parameter, a basis is provided for the analysis of the rock crack propagation mechanism.

14. The fine detection method for crack initiation and propagation of a rock specimen during loading process according to claim 9, wherein the distributed optical fiber sound wave acquisition system comprises a multi-channel distributed optical fiber sound wave acquisition module and a distributed optical fiber group, there are six distributed optical fibers in the distributed optical fiber group, the first to the fifth distributed optical fiber are equidistantly spirally arranged on the inner wall of the organic glass skeleton, the sixth distributed optical fiber is vertically arranged on the inner wall of the organic glass skeleton, the distributed optical fiber is a bare fiber coated with only one layer of an optical fiber material, the first to the sixth distributed optical fiber are respectively electrically connected to the multi-channel distributed optical fiber sound wave acquisition module, and the multi-channel distributed optical fiber sound wave acquisition module is electrically connected to the computer.

15. The fine detection method for crack initiation and propagation of a rock specimen during loading process according to claim 14, wherein in the step four, the single-field parameter analysis method is specifically as follows:

the single-field parameter analysis method refers to the analysis of the response of a certain parameter in combination with the time-force curve of loading, and the common variable is time: the standard rock specimen is placed in the device, and a servo device is used for loading until the standard rock specimen is completely destroyed; the whole recording time in the loading and fracturing process of the rock specimen, axial pressure and parameters to be analyzed are continuously collected; the time is taken as the x axis, the axial pressure and the corresponding parameters to be analyzed are taken as the double y axes to draw a graph, so that the corresponding response curve can be obtained; and then, according to the sudden change of the parameter, a basis is provided for the analysis of the rock crack propagation mechanism.

16. The fine detection method for crack initiation and propagation of a rock specimen during loading process according to claim 9, wherein in the step four, the single-field parameter analysis method is specifically as follows:

the single-field parameter analysis method refers to the analysis of the response of a certain parameter in combination with the time-force curve of loading, and the common variable is time: the standard rock specimen is placed in the device, and a servo device is used for loading until the standard rock specimen is completely destroyed; the whole recording time in the loading and fracturing process of the rock specimen, axial pressure and parameters to be analyzed are continuously collected; the time is taken as the x axis, the axial pressure and the corresponding parameters to be analyzed are taken as the double y axes to draw a graph, so that the corresponding response curve can be obtained; and then, according to the sudden change of the parameter, a basis is provided for the analysis of the rock crack propagation mechanism.

17. The fine detection method for crack initiation and propagation of a rock specimen during loading process according to claim 8, wherein in the step four, the single-field parameter analysis method is specifically as follows:

the single-field parameter analysis method refers to the analysis of the response of a certain parameter in combination with the time-force curve of loading, and the common variable is time: the standard rock specimen is placed in the device, and a servo device is used for loading until the standard rock specimen is completely destroyed; the whole recording time in the loading and fracturing process of the rock specimen, axial pressure and parameters to be analyzed are continuously collected; the time is taken as the x axis, the axial pressure and the corresponding parameters to be analyzed are taken as the double y axes to draw a graph, so that the corresponding response curve can be obtained; and then, according to the sudden change of the parameter, a basis is provided for the analysis of the rock crack propagation mechanism.

18. The fine detection method for crack initiation and propagation of a rock specimen during loading process according to claim 7, wherein in the step four, the single-field parameter analysis method is specifically as follows:

the single-field parameter analysis method refers to the analysis of the response of a certain parameter in combination with the time-force curve of loading, and the common variable is time: the standard rock specimen is placed in the device, and a servo device is used for loading until the standard rock specimen is completely destroyed; the whole recording time in the loading and fracturing process of the rock specimen, axial pressure and parameters to be analyzed are continuously collected; the time is taken as the x axis, the axial pressure and the corresponding parameters to be analyzed are taken as the double y axes to draw a graph, so that the corresponding response curve can be obtained; and then, according to the sudden change of the parameter, a basis is provided for the analysis of the rock crack propagation mechanism.

19. The fine detection method for crack initiation and propagation of a rock specimen during loading process according to claim 7, wherein in the step four, the multi-field parameter conjoint analysis method is specifically as follows:

the multi-field parameter conjoint analysis method refers to the comparative analysis of multi-field parameters, the common variable is time, and the multi-field parameters at a certain moment are screened out in turn, and the correlation analysis is carried out to obtain the response correlation among the parameters: the standard rock specimen is placed in the device, and the servo device is used for loading until the standard rock specimen is completely destroyed, and the time in the whole loading and fracturing process of the rock specimen, axial pressure, resistivity, spontaneous potential, electrode current, electrode potential, sound wave amplitude and sound emission event count are continuously collected and recorded, wherein according to the common variable of time, the parameter values at different moments are counted and correlation analysis is carried out;

the correlation analysis of each parameter value specifically comprises correlation analysis between two parameters, correlation analysis among three parameters and correlation analysis among more than three parameters; the correlation analysis between two parameters is specifically as follows: one parameter to be analyzed at a certain loading moment of measuring points is taken as the x axis, and the other parameter to be analyzed is taken as the y coordinate to get points; then, curve fitting is carried out to obtain a corresponding correlation curve of the two parameters, and the identification basis is provided for the crack initiation and propagation of the loaded rock specimen according to the slope of a fitted curve; the correlation analysis among three parameters is specifically as follows: the first parameter to be analyzed at a certain loading moment of measuring points is taken as the x axis, the second parameter to be analyzed is taken as the y coordinate, and the third parameter to be analyzed is taken as the z coordinate to get points; then, surface fitting is carried out to obtain a response relation curved surface based on the three parameters, and the identification basis is provided for the crack initiation and propagation of the loaded rock specimen according to the curvature radius of a fitting surface; and the correlation analysis among more than three parameters is as follows: based on SPASS software, multiple linear regression analysis or multiple nonlinear regression analysis is carried out, and through the conjoint analysis of multiple parameters, a reference is provided for fine detection of the initiation and propagation of cracks in the rock specimen.

20. The fine detection method for crack initiation and propagation of a rock specimen during loading process according to claim 7, wherein in the step four, the digital rock core reconstruction method based on field parameters is specifically as follows:

according to different physical field parameters, the geophysical field reconstruction of the digital rock core is realized: the standard rock specimen is placed in the device, and the servo device is used for loading until the standard rock specimen is completely destroyed; through continuous testing, the distribution situations of the parameters to be analyzed at different three-dimensional coordinate points at different moments are obtained; and accordingly, the spatial distribution situation of the parameters to be analyzed at a certain loading moment is obtained, that is, the different values of the parameters to be analyzed of the digital rock core at a certain loading moment can be obtained by taking different loading moments.

* * * * *